United States Patent
Ikeda et al.

(10) Patent No.: US 9,621,153 B2
(45) Date of Patent: Apr. 11, 2017

(54) GATE CONTROL DEVICE, SEMICONDUCTOR DEVICE, AND METHOD FOR CONTROLLING SEMICONDUCTOR DEVICE

(71) Applicant: Kabushiki Kaisha Toshiba, Minato-ku (JP)

(72) Inventors: Kentaro Ikeda, Kawasaki (JP); Masahiko Kuraguchi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/824,228

(22) Filed: Aug. 12, 2015

(65) Prior Publication Data

US 2016/0087625 A1    Mar. 24, 2016

(30) Foreign Application Priority Data

Sep. 19, 2014 (JP) .................... 2014-192014

(51) Int. Cl.
*H03B 1/00* (2006.01)
*H03K 3/01* (2006.01)
(Continued)

(52) U.S. Cl.
CPC ....... *H03K 17/687* (2013.01); *H01L 29/2003* (2013.01); *H01L 29/7786* (2013.01);
(Continued)

(58) Field of Classification Search
CPC .................................................. H03K 17/687
(Continued)

(56) References Cited

U.S. PATENT DOCUMENTS 5,986,484 A    11/1999  Kimata
2009/0066402 A1   3/2009  Hiyama
(Continued)

FOREIGN PATENT DOCUMENTS

EP     0 817 381 A2    1/1998
EP     0 817 381 A3    1/1998
(Continued)

OTHER PUBLICATIONS

Extended European Search Report issued Feb. 4, 2016 in Patent Application No. 15179431.0.
(Continued)

*Primary Examiner* — Lincoln Donovan
*Assistant Examiner* — Metasebia Retebo
(74) *Attorney, Agent, or Firm* — Oblon, McClelland, Maier & Neustadt, L.L.P.

(57) ABSTRACT

A semiconductor device according to an embodiments controls a gate voltage to be applied to a gate electrode of a junction field effect transistor including a source electrode, a drain electrode, and the gate electrode, the transistor having a first threshold voltage at which the transistor is turned on, and a second threshold at which conductivity modulation occurs in the transistor so as to make the gate voltage equal to or higher than the second threshold voltage when a forward current in a direction from the drain electrode toward the source electrode flows, and so as to make the time variation in gate voltage have a point from which the rate of the time variation starts decreasing at a voltage between the second threshold voltage and the first threshold voltage when the forward current to be shut down.

28 Claims, 11 Drawing Sheets

(51) Int. Cl.
*H03K 17/687* (2006.01)
*H01L 29/778* (2006.01)
*H01L 29/20* (2006.01)
*H03K 17/0412* (2006.01)
*H03K 17/06* (2006.01)
*H03K 17/16* (2006.01)
*H01L 29/10* (2006.01)

(52) U.S. Cl.
CPC ... *H01L 29/7787* (2013.01); *H03K 17/04123* (2013.01); *H03K 17/063* (2013.01); *H03K 17/163* (2013.01); *H01L 29/1066* (2013.01); *H03K 2217/0036* (2013.01)

(58) Field of Classification Search
USPC .......................................................... 327/109
See application file for complete search history.

(56) References Cited

U.S. PATENT DOCUMENTS

| | | |
|---|---|---|
| 2009/0121775 A1 | 5/2009 | Ueda et al. |
| 2010/0148846 A1 | 6/2010 | Hiyama |
| 2011/0133790 A1 | 6/2011 | Nagata et al. |
| 2012/0032710 A1 | 2/2012 | Tsukada |
| 2012/0153998 A1* | 6/2012 | Kitamura ......... H03K 17/04106 327/109 |

FOREIGN PATENT DOCUMENTS

| | | |
|---|---|---|
| EP | 2 418 774 A1 | 2/2012 |
| JP | 2007-19309 | 1/2007 |
| JP | 2012-244613 | 12/2012 |
| JP | 2013-42193 | 2/2013 |

OTHER PUBLICATIONS

Yasuhiro Uemoto, et al., "Recent Advances of High Voltage AlGaN/GaN Power HFETs" Spie Gallium Nitride Materials and Devices IV, Proc. of SPIE, vol. 7216, XP040493166, Feb. 17, 2009, pp. 721606-1-721606-11.

Satoshi Tamura et al, "Recent Advances in GaN Power Switching Devices", Compound Semiconductor Integrated Circuit Symposium (CSICS), IEEE, 2010, 4 pages.

* cited by examiner $Vth_1 \leq Vgs < Vth_2$

- ● ELECTRON  ⟶ FLOW OF ELECTRON
- ○ HOLE  ------▶ FLOW OF HOLE $Vth_2 \leq Vgs$

- ● ELECTRON  ⟶ FLOW OF ELECTRON
- ○ HOLE  ------▶ FLOW OF HOLE $Vth_1 \leq Vgs-Vds < Vth_2$

- ● ELECTRON  ⎯⎯→ FLOW OF ELECTRON
- ○ HOLE  ------→ FLOW OF HOLE $Vth_2 \leq Vgs-Vds$

- ● ELECTRON  ⎯⎯→ FLOW OF ELECTRON
- ○ HOLE  ------→ FLOW OF HOLE

US 9,621,153 B2

GATE CONTROL DEVICE, SEMICONDUCTOR DEVICE, AND METHOD FOR CONTROLLING SEMICONDUCTOR DEVICE

CROSS-REFERENCE TO RELATED APPLICATION

This application is based upon and claims the benefit of priority from Japanese Patent Application No. 2014-192014, filed on Sep. 19, 2014, the entire contents of which are incorporated herein by reference.

FIELD

Embodiments described herein relate generally to agate control device, a semiconductor device, and a method for controlling the semiconductor device.

BACKGROUND

Group III nitride, for example, a gallium nitride (GaN) based semiconductor is expected to be used as a material for next-generation power semiconductor devices. The GaN based semiconductor device has a wider bandgap than that of a silicon (Si) semiconductor device, and thus can achieve a high breakdown voltage and a low loss in comparison to the Si semiconductor device.

A High Electron Mobility Transistor (HEMT) structure using a two dimensional electron gas (2DEG) as the carrier is widely applied to a GaN based transistor. A junction HEMT is one type of GaN based HEMTs.

For example, using a p-type GaN based semiconductor for a gate electrode in a junction HEMT can achieve the normally off operation. Meanwhile, injecting a positive hole (hole) from the gate electrode to a channel causes conductivity modulation. This can reduce the on-resistance of the junction HEMT. However, the injection of a hole unfortunately increases the switching time of the junction HEMT.

DETAILED DESCRIPTION

A gate control device of an embodiment is configured to control a gate voltage to be applied to a gate electrode of a junction field effect transistor including a source electrode, a drain electrode, and the gate electrode, the transistor having a first threshold voltage at which the transistor is turned on, and a second threshold voltage at which conductivity modulation occurs in the transistor so as to make the gate voltage equal to or higher than the second threshold voltage when a forward current in a direction from the drain electrode toward the source electrode flows, and so as to make a time variation in the gate voltage have a point from which a rate of the time variation starts decreasing at a voltage between the second threshold voltage and the first threshold voltage when the forward current to be shut down.

The embodiments of the present disclosure will be described with reference to the appended drawings. Note that, in the description below, the same components and the like are denoted with the same reference signs and the descriptions of the components and the like that have been described are appropriately omitted.

Herein, the semiconductor device may be a power module that is a combination of a plurality of elements such as a discrete semiconductor. The semiconductor device may be an intelligent power module formed by a plurality of elements such as a discrete semiconductor in which a drive circuit configured to drive the elements or a self-protection function is embedded. The semiconductor device may be an entire system including a power module or an intelligent power module.

Herein, semiconductors including gallium nitride (GaN), aluminum nitride (AlN), indium nitride (InN), and their intermediate compositions are collectively referred to as a "GaN based semiconductor".

Herein, a "gate voltage" and a "drain voltage" mean voltages based on a "source voltage".

First Embodiment

A semiconductor device according to the present embodiment includes: a junction field effect transistor including a source electrode, a drain electrode, and a gate electrode, and further including and further including a first threshold voltage at which the transistor is turned on and a current starts flowing between the source electrode and the drain electrode, and a second threshold voltage at which conductivity modulation occurs in the transistor and a current starts flowing between the source electrode and the gate electrode; and a gate control device configured to control a gate voltage to be applied to the gate electrode so as to make the gate voltage equal to or higher than the second threshold voltage when a forward current in a direction from the drain electrode toward the source electrode flows, and so as to make a time variation in the gate voltage have a point from which the rate of the time variation starts decreasing at a voltage between the second threshold voltage and the first threshold voltage when the forward current is shut down.

Figure 1A:
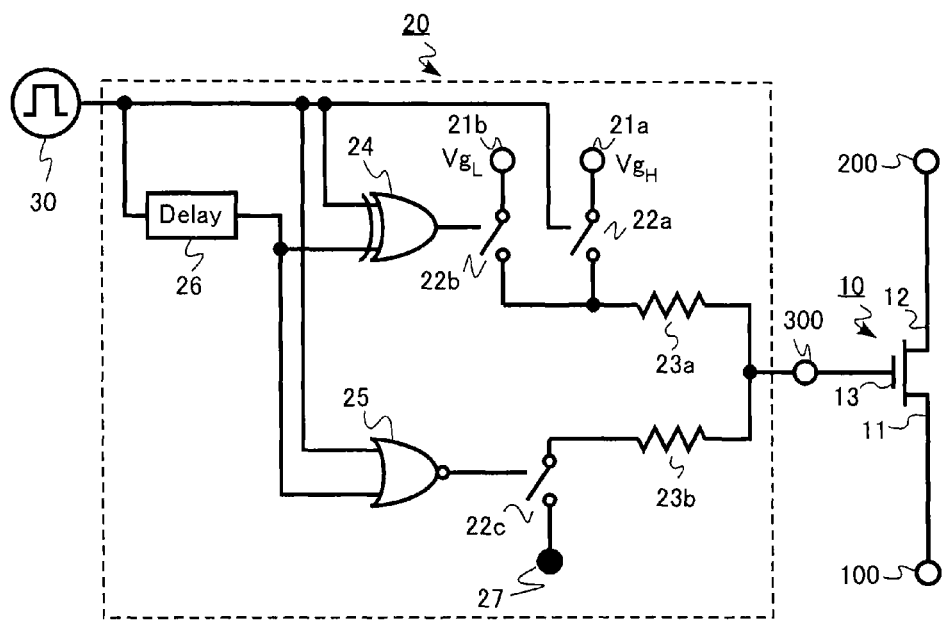
FIGS. 1A and 1B are circuit diagrams of the primary components of the semiconductor device according to a first embodiment.
Figure 1B:
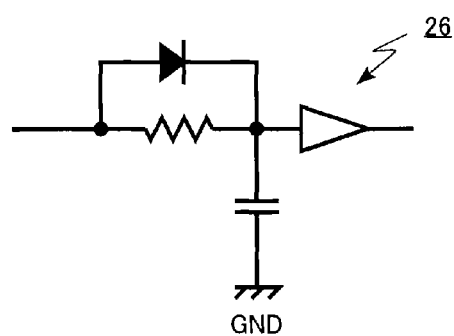

FIGS. 1A and 1B are circuit diagrams of the primary components of the semiconductor device according to the present embodiment. The semiconductor device according to the present embodiment is, for example, an intelligent power module including an inverter circuit. FIGS. 1A and 1B are diagrams of a switching unit included in the inverter circuit. FIG. 1A is a circuit diagram of the entire switching unit, and FIG. 1B is a circuit diagram of an exemplary delay circuit in the switching unit.

The semiconductor device according to the present embodiment includes a GaN based HEMT 10 that is an exemplary junction field effect transistor (JFET), and a gate drive circuit 20 that is an exemplary gate control device.

Figure 2:
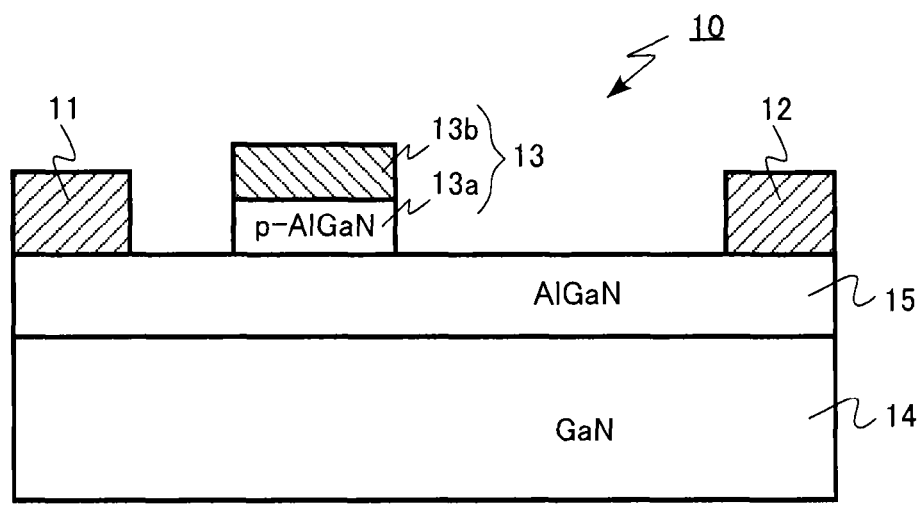
FIG. 2 is a schematic cross-sectional view of the junction field effect transistor according to the first embodiment.

FIG. 2 is a schematic cross-sectional view of the junction field effect transistor according to the present embodiment. The GaN based HEMT 10 is a normally off transistor. The GaN based HEMT 10 includes a GaN channel layer 14, an AlGaN barrier layer 15, a source electrode 11, a drain electrode 12, and a gate electrode 13.

The source electrode 11 and the drain electrode 12 are, for example, metal. The gate electrode 13 has, for example, a stacked structure with a p-type AlGaN capping layer 13a and a metallic layer 13b.

Figure 3A:
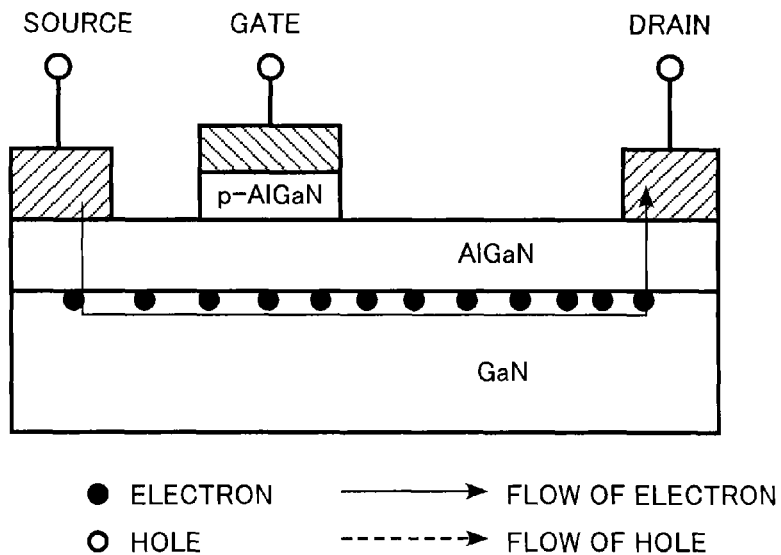
FIGS. 3A and 3B are explanatory diagrams of the operation of the junction field effect transistor according to the first embodiment.
Figure 3B:
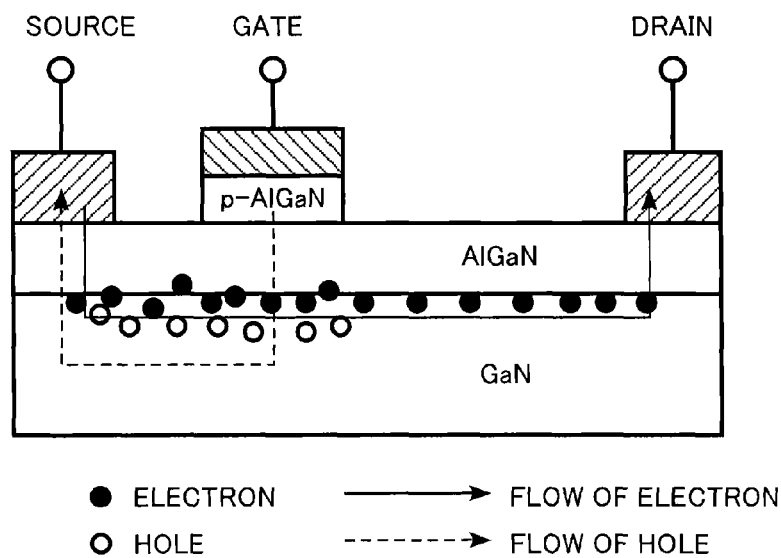

FIGS. 3A and 3B are explanatory diagrams of the operation of the junction field effect transistor according to the present embodiment.

Two dimensional electron gas (2DEG) is induced on the interface of the GaN channel layer 14 and the AlGaN barrier layer 15 in the GaN based HEMT 10. When a voltage equal to or higher than a first threshold voltage ($Vth_1$) is applied as a gate voltage to the gate electrode 13, the transistor is turned on. When the transistor is turned on, a current starts flowing between the source electrode 11 and the drain electrode 12 (FIG. 3A).

Herein, a current flowing in a direction from the drain electrode 12 to the source electrode 11 is referred to as a forward current, and a current flowing in a direction from the source electrode 11 to the drain electrode 12 is referred to as a reverse current. FIGS. 3A and 3B illustrates that the forward current flows. Note that the direction of current is opposite to flow direction of electron.

When a gate voltage higher than a forward drop voltage ($V_F$) on the junction of the AlGaN barrier layer 15 and the p-type AlGaN capping layer 13a is applied to the gate electrode 13, a hole is injected from the gate electrode 13 to the channel layer 14. This causes the conductivity modulation (FIG. 3B). The gate voltage at which the conductivity modulation occurs is a second threshold voltage ($Vth_2$). The conductivity modulation reduces the on-resistance of the GaN based HEMT 10. Meanwhile, the gate current flows between the gate electrode 13 and the source electrode 11.

Figure 4A:
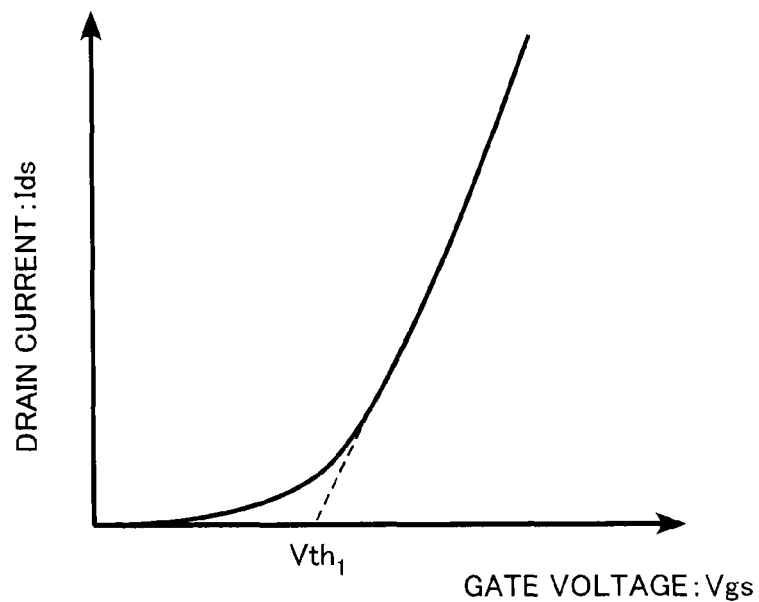
FIGS. 4A and 4B are explanatory diagrams of the threshold voltages of the junction field effect transistor according to the first embodiment.
Figure 4B:
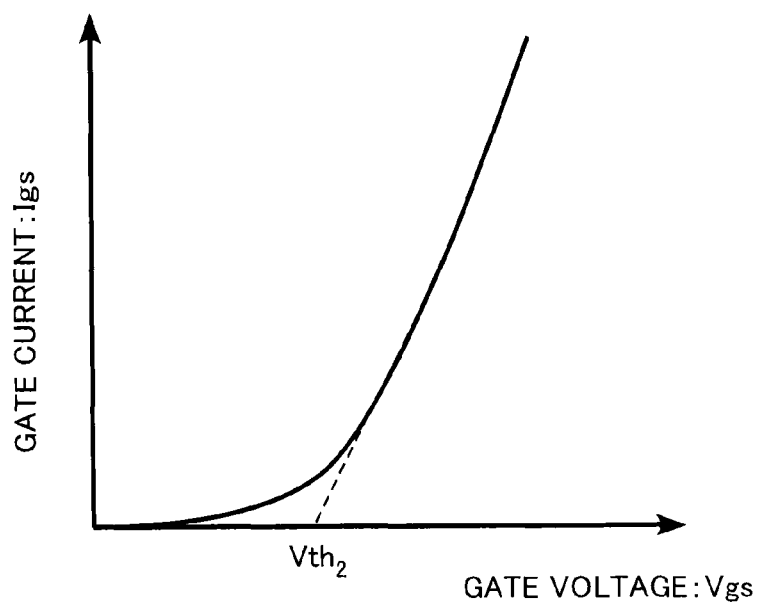

FIGS. 4A and 4B are explanatory diagrams of the threshold voltages of the junction field effect transistor according to the present embodiment. FIG. 4A is a diagram of the definition of the first threshold voltage ($Vth_1$) and FIG. 4B is a diagram of the definition of the second threshold voltage ($Vth_2$).

As illustrated in FIG. 4A, the first threshold voltage ($Vth_1$) at which the transistor is turned on is defined as the value of the x-axis intercept when the tangent to the curve of current and voltage has the largest gradient while the gate voltage is shown on the X axis and the drain current is shown on the Y axis. As illustrated in FIG. 4B, the second threshold voltage ($Vth_2$) at which the conductivity modulation occurs in the transistor is defined as the value of the x-axis intercept when the tangent to the curve of current and voltage has the largest gradient while the gate voltage is shown on the X axis and the gate current is shown on the Y axis. The voltage and current are measured while the drain voltage (Vd)=1 V holds.

As illustrated in FIG. 1A, the source electrode 11, the drain electrode 12, and the gate electrode 13 are connected to the source terminal 100, the drain terminal 200, and the gate terminal 300, respectively, in the GaN based HEMT 10. The drain terminal 200 is connected, for example, to an inductive load such as a motor.

The gate drive circuit 20 includes: a power source terminal 21a to which a power source for high gate voltage ($Vg_H$) is connected; a power source terminal 21b to which a power source for low gate voltage ($Vg_L$) is connected; switch circuits 22a, 22b, and 22c; resistance elements 23a and 23b; an XOR circuit 24; a NOR circuit 25; a delay circuit 26; and a terminal 27 at a potential equal to the potential of the source terminal 100 or a potential lower than the potential of the source terminal 100. FIG. 1B illustrates an example of the delay circuit 26.

The gate drive circuit 20 is connected to a gate drive signal generation source 30. The gate drive circuit 20 controls the gate voltage of the GaN based HEMT 10 in accordance with on and off signals input from the gate drive signal generation source 30.

The gate drive circuit 20 has a function of controlling the gate voltage so as to make the gate voltage equal to or higher than the second threshold voltage ($Vth_2$) when the forward current in the direction from the drain electrode 12 toward the source electrode 11 flows, and controlling the gate voltage so as to make the time variation in gate voltage have a point from which the rate of the time variation starts decreasing at a voltage between the second threshold voltage ($Vth_2$) and the first threshold voltage ($Vth_1$) when the forward current to be shut down.

Next, a method for controlling the semiconductor device according to the present embodiment will be described.

The method for controlling the semiconductor device according to the present embodiment is used to control the gate voltage so as to make the gate voltage equal to or higher than the second threshold voltage when the forward current flows from the drain electrode toward the source electrode. The gate voltage is applied to the gate electrode of the junction field effect transistor including the source electrode, the drain electrode, and the gate electrode, and having the first threshold voltage at which a current starts flowing between the source electrode and the drain electrode, and the second threshold voltage at which a current starts flowing between the source electrode and the gate electrode. The method is used to control the gate voltage so as to make the time variation in gate voltage have a point from which the rate of the time variation starts decreasing at a voltage between the second threshold voltage and the first threshold voltage when the forward current to be shut down.

Figure 5:
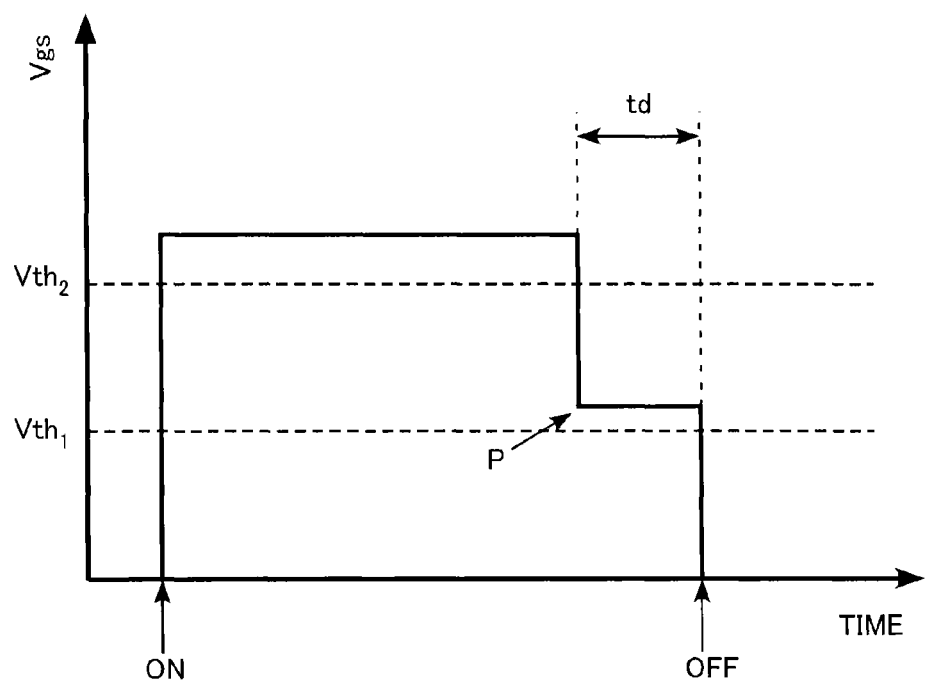
FIG. 5 is an explanatory diagram of an exemplary method for controlling the semiconductor device according to the first embodiment.

FIG. 5 is an explanatory diagram of an exemplary method for controlling the semiconductor device according to the present embodiment. The time is shown on the horizontal axis, and the gate voltage (Vgs) applied to the gate electrode 13 of the GaN based HEMT 10 illustrated in FIG. 1A is shown on the vertical axis.

When the GaN based HEMT 10 is turned on, in other words, when the forward current in the direction from the drain electrode 12 toward the source electrode 11 flows, the gate drive circuit 20 controls the gate voltage so as to make the gate voltage equal to or higher than the second threshold voltage (Vth$_2$). The gate voltage equal to or higher than the second threshold voltage (Vth$_2$) injects a hole to the channel layer 14, and thus causes the conductivity modulation. This maintains a low on-resistance of the GaN based HEMT 10.

Next, when the GaN based HEMT 10 is turned off, in other words, when the forward current is shut down, the gate drive circuit 20 controls the gate voltage so as to make the time variation in gate voltage have a point from which the rate of the time variation starts decreasing at a voltage between the second threshold voltage (Vth$_2$) and the first threshold voltage (Vth$_1$) (a point P in FIG. 5). Subsequently, the gate drive circuit 20 controls the gate voltage so as to make the gate voltage lower than the first threshold voltage (Vth$_1$).

FIG. 5 illustrates that the gate drive circuit 20 controls the gate voltage so as to vary the gate voltage in a staircase pattern and maintain the gate voltage at a constant voltage between the second threshold voltage (Vth$_2$) and the first threshold voltage (Vth$_1$) for a predetermined time (td). In the case of FIG. 5, the rate of time variation in gate voltage becomes zero at the point P.

In the gate drive circuit 20 illustrated in FIG. 1A, a voltage (Vg$_H$) equal to or higher than the second threshold voltage (Vth$_2$) is supplied from the power source terminal 21a, and a voltage (Vg$_L$) between the second threshold voltage (Vth$_2$) and the first threshold voltage (Vth$_1$) is supplied from the power source terminal 21b.

Figure 6:
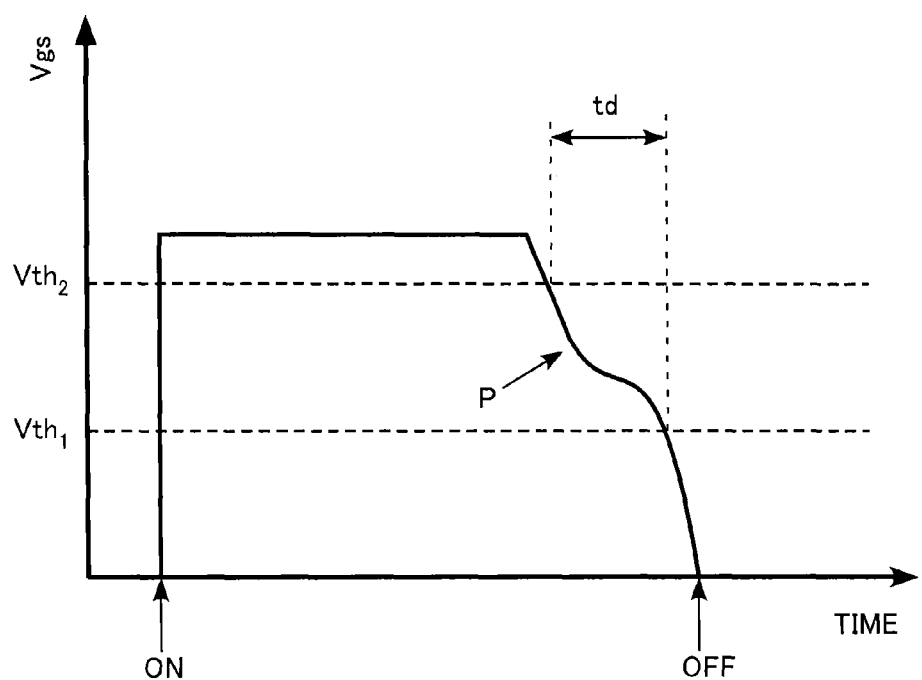
FIG. 6 is an explanatory diagram of another exemplary method for controlling the semiconductor device according to the first embodiment.

FIG. 6 is an explanatory diagram of another exemplary method for controlling the semiconductor device according to the present embodiment. The time is shown on the horizontal axis, and the gate voltage applied to the gate electrode 13 of the GaN based HEMT 10 illustrated in FIG. 1A is shown on the vertical axis.

Differently from FIG. 5, the gate voltage is gradually reduced when the GaN based HEMT 10 is turned off in FIG. 6. Also in FIG. 6, the gate voltage is controlled such that the time variation in gate voltage has a point from which the rate of the time variation starts decreasing at a voltage between the second threshold voltage (Vth$_2$) and the first threshold voltage (Vth$_1$) (a point P in FIG. 6). In the case of FIG. 6, the gate voltage is maintained at a voltage between the second threshold voltage (Vth$_2$) and the first threshold voltage (Vth$_1$) for a predetermined time (td). In the case of FIG. 6, the gate voltage is controlled such that a curve of time and voltage has an inflection point protruding downward between the second threshold voltage (Vth$_2$) and the first threshold voltage (Vth$_1$).

Next, the functions and effects of the present embodiment will be described.

Figure 7:
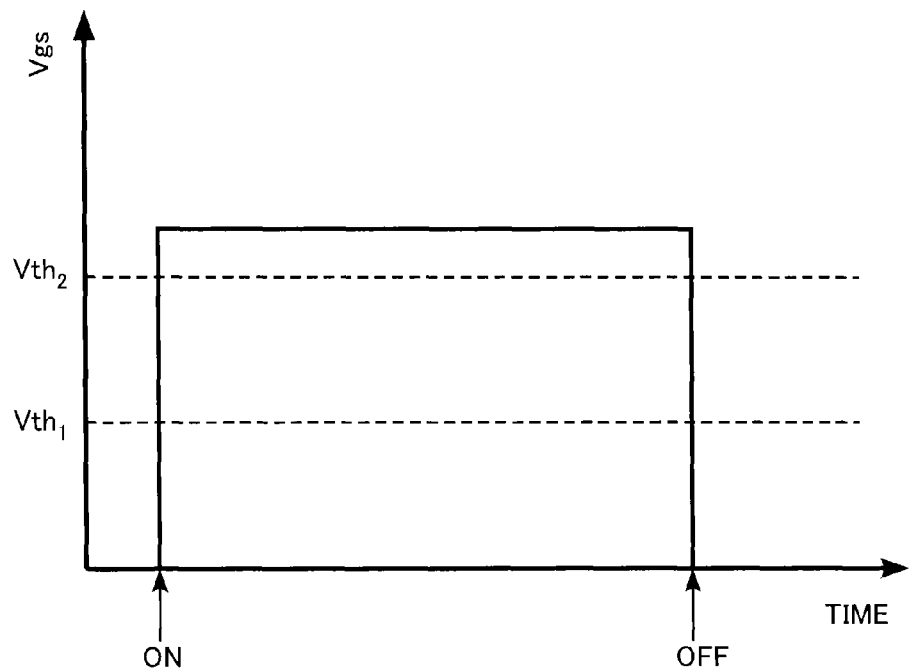
FIG. 7 is an explanatory diagram of an exemplary method for controlling the semiconductor device according to a comparative embodiment.

FIG. 7 is an explanatory diagram of an exemplary method for controlling the semiconductor device according to a comparative embodiment. The time is shown on the horizontal axis, and a gate voltage (Vgs) to be applied to a gate electrode of a GaN based HEMT is shown on the vertical axis.

Similarly to the present embodiment, the gate voltage is controlled such that the gate voltage is equal to or higher than a second threshold voltage (Vth$_2$) in the comparative embodiment when the GaN based HEMT is turned on. On the other hand, differently from the present embodiment, the gate voltage is linearly reduced to zero when the GaN based HEMT is turned off.

In the comparative embodiment, the hole injected into the channel layer remains after the gate voltage decreases to zero. The drain current continues flowing until the hole disappears. This unfortunately elongates the switching time.

According to the present embodiment, when the GaN based HEMT 10 is turned off, in other words, when the forward current is shut down, the gate drive circuit 20 controls the gate voltage so as to make the time variation in gate voltage have a point from which the rate of the time variation starts decreasing at a voltage between the second threshold voltage (Vth$_2$) and the first threshold voltage (Vth$_1$) (the points P in FIGS. 5 and 6). This control maintains the state in which the transistor is on without the injection of a hole for a predetermined time (td) until the time when the gate voltage becomes zero.

Providing a period of time in which a hole is not injected causes the hole in the channel layer 14 to disappear in the period. This can reduce the switching time of the GaN based HEMT 10.

Figure 8:
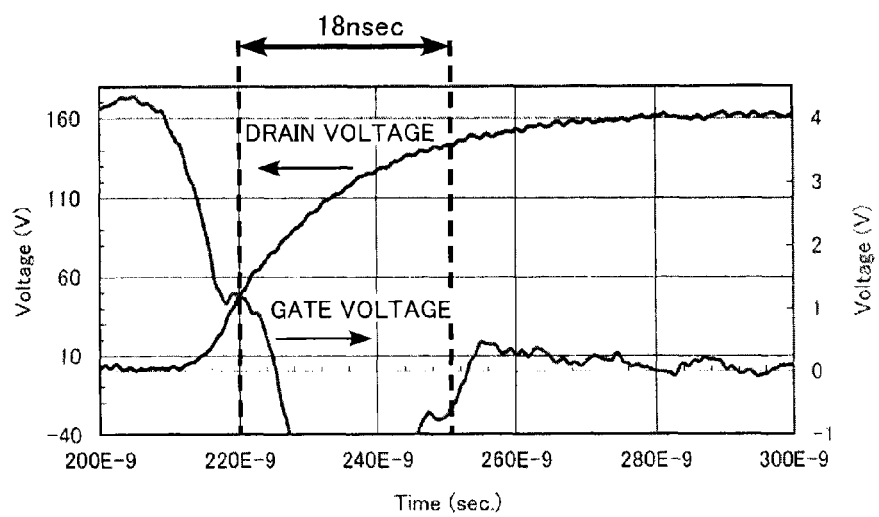
FIG. 8 is a diagram of the simulation results of the operation of the semiconductor device according to the comparative embodiment.

FIG. 8 illustrates the waveforms of the actual measurement of the operation of the semiconductor device according to the comparative embodiment. To measure the delay of the switching time due to the hole, the gate voltage is reduced to a negative voltage.

It takes 18 nanoseconds for the drain voltage to reach a desired value even when the HEMT is turned off after the gate voltage sufficiently decreases. The hole can remain in the channel layer at least for the period of 18 nanoseconds.

Thus, the predetermined time (td) in which the gate voltage is maintained at a voltage between the second threshold voltage (Vth$_2$) and the first threshold voltage (Vth$_1$) is preferably equal to or longer than 18 nanoseconds in the present embodiment.

Next, the case in which the semiconductor device according to the present embodiment is controlled in the following manner in the method for controlling the semiconductor device according to the present embodiment will be described. When the reverse current in the direction from the source electrode toward the drain electrode flows, the semiconductor device is controlled such that the difference between the gate voltage and the drain voltage is equal to or higher than the second threshold voltage. When the difference between the gate voltage and the drain voltage is reduced from the second threshold voltage, the semiconductor device is controlled such that the time variation in difference between the gate voltage and the drain voltage has a point from which the rate of the time variation starts decreasing at a voltage between the second threshold voltage and the first threshold voltage and the difference between the gate voltage and the drain voltage is subsequently kept equal to or lower than the first threshold voltage.

The case in which the reverse current in the direction from the source electrode toward the drain electrode flows is, for example, the case in which the semiconductor device is a switching unit including an inverter circuit and a return current flows in the GaN based HEMT 10. In other words, the case in which a relatively positive voltage is applied to the source terminal 100 and a relatively negative voltage is applied to the drain terminal 200 in FIGS. 1A and 1B.

Figure 9A:
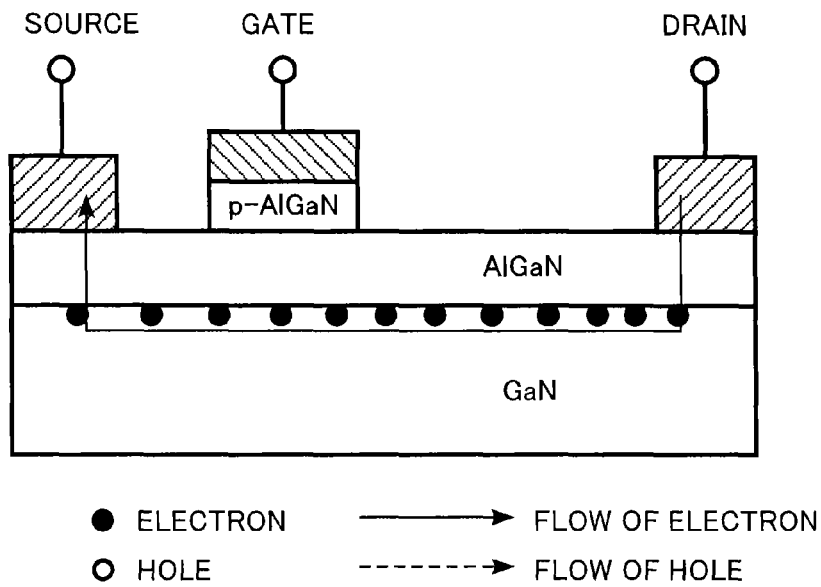
FIGS. 9A and 9B are explanatory diagrams of the operation of the junction field effect transistor according to the first embodiment.
Figure 9B:
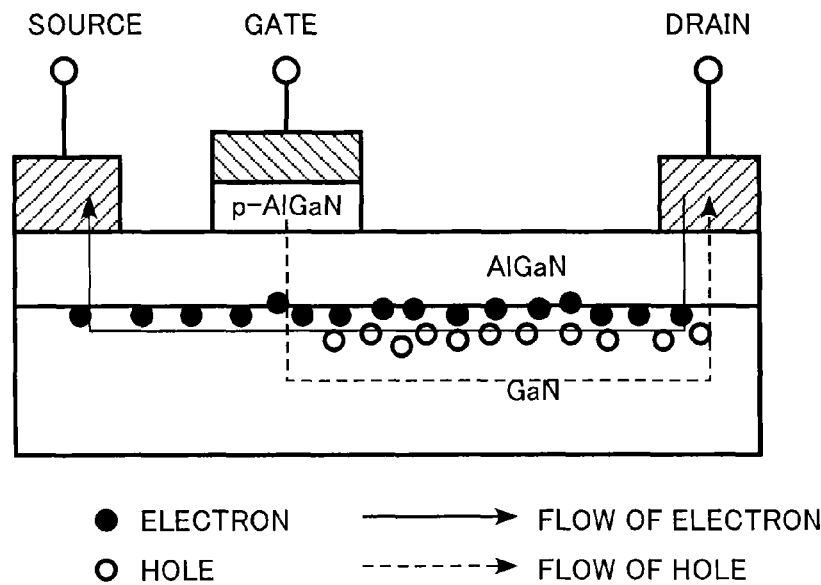

FIGS. 9A and 9B are explanatory diagrams of the operation of the junction field effect transistor according to the first embodiment. The operation for causing the reverse current in the direction from the source electrode 11 toward the drain electrode 12 to flow will be described. When the reverse current flows, the voltage of the source electrode 11 is relatively higher than that of the drain electrode 12.

Two dimensional electron gas (2DEG) is induced on the interface between the GaN channel layer 14 and the AlGaN barrier layer 15 in the GaN based HEMT 10. When a voltage at which the difference between the gate voltage and the drain voltage is equal to or higher than the first threshold voltage ($Vth_1$) is applied to the gate electrode 13 and the drain electrode 12, the transistor is turned on. When the transistor is turned on, a current starts flowing between the source electrode 11 and the drain electrode 12 (FIG. 9A).

As described above, the current in the direction from the drain electrode 12 toward the source electrode 11 is referred to as the forward current, and the current in the direction from the source electrode 11 toward the drain electrode 12 is referred to as the reverse current herein. FIGS. 9A and 9B illustrates that the reverse current flows.

When a voltage at which the difference between the gate voltage and the drain voltage is equal to or higher than the second threshold voltage ($Vth_2$) is applied to the gate electrode 13 and the drain electrode 12, the conductivity modulation occurs. This reduces the on-resistance of the GaN based HEMT 10 (FIG. 9B).

The gate drive circuit 20 preferably includes a function of controlling the gate voltage in the following manner. When the reverse current in the direction from the source electrode 11 toward the drain electrode 12 flows, the gate drive circuit 20 controls the difference between the gate voltage and the drain voltage so as to make the difference between the gate voltage and the drain voltage equal to or higher than the second threshold voltage ($Vth_2$). When the difference between the gate voltage and the drain voltage is reduced from the second threshold voltage ($Vth_2$), the gate drive circuit 20 controls the difference between the gate voltage and the drain voltage so as to make the time variation in difference between the gate voltage and the drain voltage have a point from which the rate of the time variation starts decreasing at a voltage between the second threshold voltage ($Vth_2$) and the first threshold voltage ($Vth_1$), and so as to subsequently keep the difference between the gate voltage and the drain voltage equal to or lower than the first threshold voltage ($Vth_1$).

The semiconductor device is preferably controlled in the following manner in the method for controlling the semiconductor device according to the first embodiment. When the reverse current in the direction from the source electrode 11 toward the drain electrode 12 flows, the semiconductor device is controlled such that the difference between the gate voltage and the drain voltage is equal to or higher than the second threshold voltage ($Vth_2$). When the difference between the gate voltage and the drain voltage is reduced from the second threshold voltage ($Vth_2$), the semiconductor device is controlled such that the time variation in difference between the gate voltage and the drain voltage has a point from which the rate of the time variation starts decreasing at a voltage between the second threshold voltage ($Vth_2$) and the first threshold voltage ($Vth_1$), and the difference between the gate voltage and the drain voltage is kept equal to or lower than the first threshold voltage ($Vth_1$).

Figure 10:
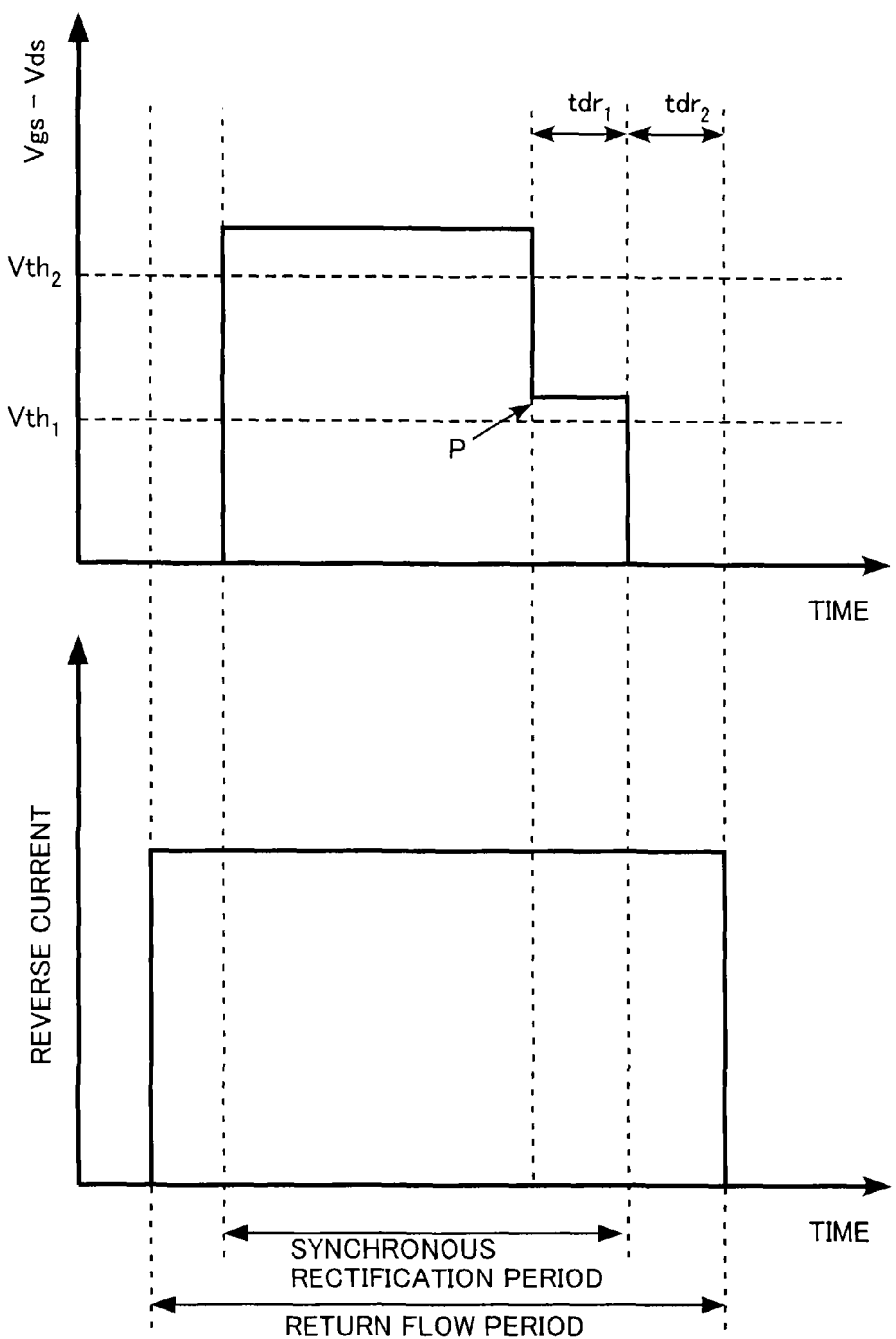
FIG. 10 is an explanatory diagram of an exemplary method for controlling the semiconductor device according to the first embodiment.

FIG. 10 is an explanatory diagram of an exemplary method for controlling the semiconductor device according to the present embodiment. The upper graph illustrates the time on the horizontal axis and the difference between the gate voltage and the drain voltage (Vgs−Vds) applied to the gate electrode 13 and the drain electrode 12 of the GaN based HEMT 10 illustrated in FIG. 1 on the vertical axis. The lower graph illustrates the reverse current flowing in the GaN based HEMT 10.

As illustrated in the lower graph, a return current flows in the GaN based HEMT 10 during a return flow period. In other words, the reverse current flows. The operation of the inverter circuit determines the return flow period.

Generally, the on-resistance of the GaN based HEMT 10 is reduced and thus the loss is reduced for a predetermined period of time in the return flow period. Thus, the difference between the gate voltage and the drain voltage is raised to a predetermined voltage. The period is referred to as a synchronous rectification period. If the return flow period is in agreement with the synchronous rectification period, a short circuit may unfortunately occur in the inverter circuit. Thus, a time lag is generally provided between the return flow period and the synchronous rectification period. A time lag before the completion of the return flow period is referred to as a second predetermined time ($tdr_2$).

If the difference between the gate voltage and the drain voltage is linearly reduced to zero when the synchronous rectification period is terminated, the hole remains in the channel layer even after the difference between the gate voltage and the drain voltage becomes zero. Thus, if the second predetermined time ($tdr_2$) is short, the reverse recovery current flows in the GaN based HEMT 10 even after the completion of the return flow period. This may unfortunately cause a short circuit in the inverter circuit.

According to the present embodiment, when the difference between the gate voltage and the drain voltage is reduced from the second threshold voltage ($Vth_2$) in the synchronous rectification period, the difference between the gate voltage and the drain voltage is controlled such that the time variation in difference between the gate voltage and the drain voltage has a point at which the rate of the time variation starts decreasing at a voltage between the second threshold voltage ($Vth_2$) and the first threshold voltage ($Vth_1$) (a point P in the upper graph in FIG. 10), and the difference between the gate voltage and the drain voltage is subsequently kept equal to or lower than the first threshold voltage ($Vth_1$).

This maintains the state in which the transistor is on without the injection of a hole for the predetermined time ($tdr_1$) in the synchronous rectification period.

Providing a period of time in which a hole is not injected causes the hole in the channel layer 14 to disappear in the period. This can prevent the reverse recovery current from flowing in the GaN based HEMT 10 and thus can prevent a short circuit from occurring in the inverter circuit.

In particular, the difference between the gate voltage and the drain voltage is controlled in the following manner in the example of FIG. 10. When the difference between the gate voltage and the drain voltage is reduced from the second threshold voltage ($Vth_2$) while varying in a staircase pattern, the difference between the gate voltage and the drain voltage is controlled such that the difference is maintained at a constant voltage between the second threshold voltage ($Vth_2$) and the first threshold voltage for the first predetermined time ($tdr_1$). Subsequently, the difference between the gate voltage and the drain voltage is kept lower than the first threshold voltage ($Vth_1$) for the second predetermined time ($tdr_2$) by the time when the reverse current is shut down, in other words, by the completion of the return flow period. In the case of FIG. 10, the rate of time variation in difference between the gate voltage and the drain voltage becomes zero at the point P.

The sum of the first predetermined time ($tdr_1$) and the second predetermined time ($tdr_2$) is preferably equal to or longer than 18 nanoseconds in terms of preventing the reverse recovery current from flowing in the GaN based HEMT 10 after the completion of the return flow period.

As described above, the present embodiment can achieve the gate control device, semiconductor device, and method for controlling the semiconductor device that reduce the switching time of a junction field effect transistor.

Second Embodiment

The semiconductor device according to the present embodiment is similar to the first embodiment except for that a gate control circuit has a different circuit configuration. Thus, the descriptions of the contents overlapping with the first embodiment will be omitted.

Figure 11:
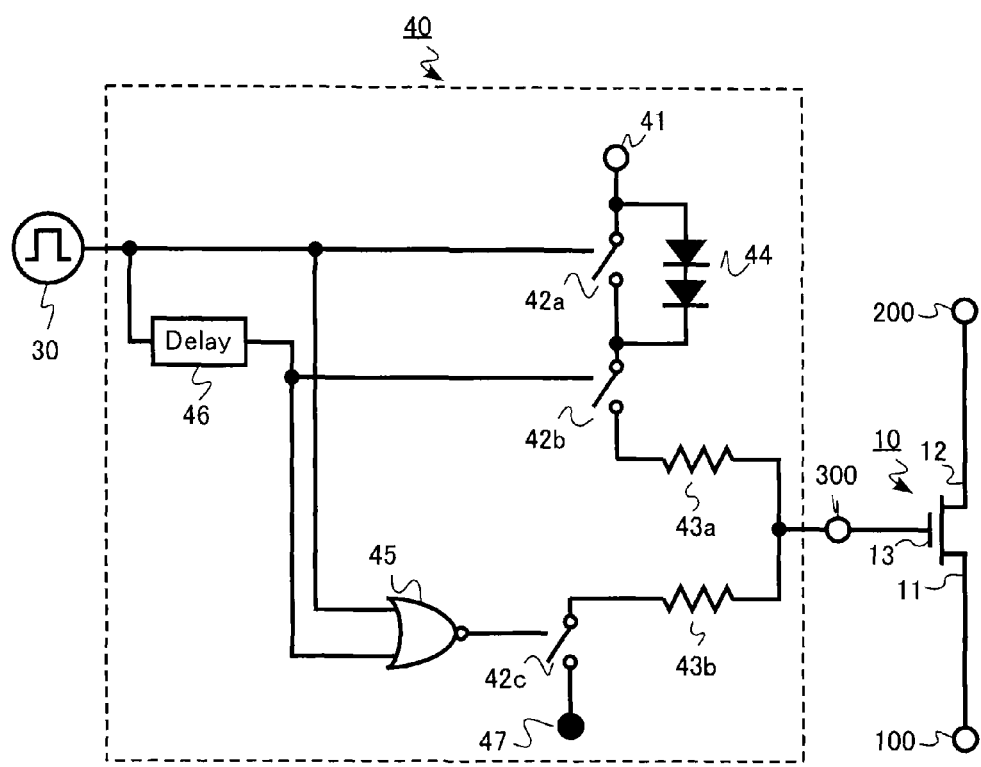
FIG. 11 is a circuit diagram of the primary components of the semiconductor device according to a second embodiment.

FIG. 11 is a circuit diagram of the primary components of the semiconductor device according to the present embodiment. The semiconductor device according to the present embodiment is, for example, an intelligent power module including an inverter circuit. FIG. 11 is a diagram of a switching unit including an inverter circuit. FIG. 11 is a circuit diagram of the entire switching unit.

A gate drive circuit 40 according to the present embodiment includes a power source terminal 41 to which a power source for gate voltage is connected, switch circuits 42a, 42b, and 42c, resistance elements 43a and 43b, a NOR circuit 45, a voltage suppression diode 44, a delay circuit 46, and a terminal 47 at a potential equal to the potential of the source terminal 100 or a potential lower than the potential of the source terminal 100. The voltage suppression diode 44 is, for example, a PIN diode.

The gate drive circuit 40 is connected to a gate drive signal generation source 30. The gate drive circuit 40 controls the gate voltage of the GaN based HEMT 10 in accordance with on and off signals input from the gate drive signal generation source 30.

Similarly to the first embodiment, the present embodiment can achieve the gate control device, semiconductor device, and method for controlling the semiconductor device that reduce the switching time of a junction field effect transistor. Furthermore, the present embodiment provides a simple circuit configuration because the circuit does not require two power sources for high and low gate voltages.

Third Embodiment

The semiconductor device according to the present embodiment is similar to the first embodiment except for that a gate control circuit has a different circuit configuration. Thus, the descriptions of the contents overlapping with the first embodiment will be omitted.

Figure 12:
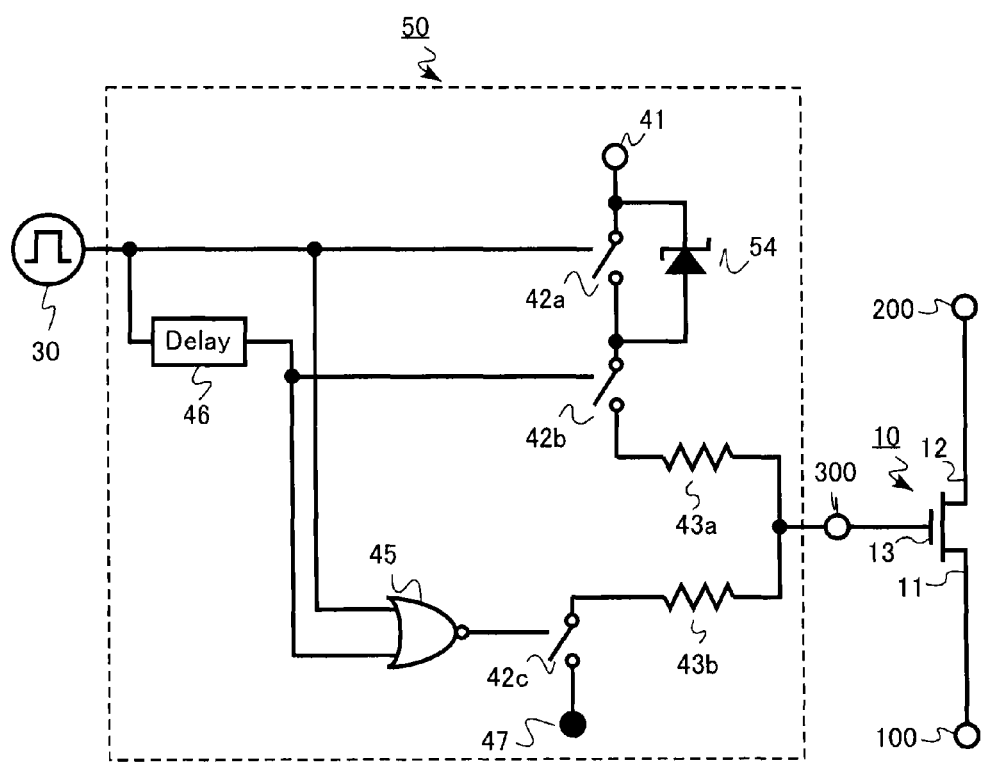
FIG. 12 is a circuit diagram of the primary components of the semiconductor device according to a third embodiment.

FIG. 12 is a circuit diagram of the primary components of the semiconductor device according to the present embodiment. The semiconductor device according to the present embodiment is, for example, an intelligent power module including an inverter circuit. FIG. 12 is a diagram of a switching unit including an inverter circuit. FIG. 12 is a circuit diagram of the entire switching unit.

A gate drive circuit 50 according to the present embodiment includes a power source terminal 41 to which a power source for gate voltage is connected, switch circuits 42a, 42b, and 42c, resistance elements 43a and 43b, a NOR circuit 45, a voltage suppression diode 54, a delay circuit 46, and a terminal 47 at a potential equal to the potential of the source terminal 100 or a potential lower than the potential of the source terminal 100. The voltage suppression diode 54 is a Zener diode.

The gate drive circuit 50 is connected to the gate drive signal generation source 30. The gate drive circuit 50 controls the gate voltage of the GaN based HEMT 10 in accordance with on and off signals input from the gate drive signal generation source 30.

Similarly to the first embodiment, the present embodiment can achieve the gate control device, semiconductor device, and method for controlling the semiconductor device that reduce the switching time of a junction field effect transistor. Furthermore, the present embodiment provides a simple circuit configuration because the circuit does not require two power sources for high and low gate voltages. Furthermore, using a Zener diode as the voltage suppression diode 54 reduces the temperature dependency that is a characteristic of the gate drive circuit 50.

Fourth Embodiment

The semiconductor device according to the present embodiment is similar to the first embodiment except for that a gate control device is a microcomputer. Thus, the descriptions of the contents overlapping with the first embodiment will be omitted.

According to the present embodiment, for example, the microcomputer and a control program stored in a memory in the microcomputer control the gate voltage of a junction field effect transistor.

Similarly to the first embodiment, the present embodiment can achieve the gate control device, semiconductor device, and method for controlling the semiconductor device that reduce the switching time of a junction field effect transistor. Furthermore, using a microcomputer as the gate control device facilitates the control of the gate voltage in synchronization with the operation of the inverter circuit, for example, the time when the inverter circuit gets into a return flow mode.

The examples in which the combination of a logic circuit and an analog circuit, and a microcomputer are used as the gate control device have been described in the embodiments. However, for example, an integrated circuit (IC) dedicated for gate control may be used as long as the gate control according to the present disclosure can be achieved.

The GaN based HEMT has been described as an example of the junction field effect transistor in the embodiments. However, the present disclosure may also be applied to, for example, a transistor made of silicon carbide (SiC) or diamond as long as such a transistor is a junction field effect transistor.

The intelligent power module including the inverter circuit has been described as an example of the semiconductor device in the embodiments. However, the present disclosure may also be applied to another semiconductor device using a junction field effect transistor.

While certain embodiments have been described, these embodiments have been presented by way of example only, and are not intended to limit the scope of the inventions. Indeed, the gate control device, the semiconductor device and method for controlling the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A gate control device configured to control a gate voltage to be applied to a gate electrode of a junction field effect transistor including a source electrode, a drain electrode, and the gate electrode, the transistor having a first threshold voltage at which the transistor is turned on, and a second threshold voltage at which conductivity modulation occurs in the transistor so as to make the gate voltage equal to or higher than the second threshold voltage when a forward current in a direction from the drain electrode toward the source electrode flows, so as to make a time variation in the gate voltage have a point from which a rate of the time variation starts decreasing at a voltage between the second threshold voltage and the first threshold voltage when the forward current to be shut down, and so as to maintain the gate voltage at a voltage between the second threshold voltage and the first threshold voltage for a predetermined time when the forward current is to be shut down, wherein the predetermined time is equal to or longer than 18 nanoseconds.

2. A gate control device configured to control a gate voltage to be applied to a gate electrode of a junction field effect transistor including a source electrode, a drain electrode, and the gate electrode, the transistor having a first threshold voltage at which the transistor is turned on, and a second threshold voltage at which conductivity modulation occurs in the transistor so as to make the gate voltage equal to or higher than the second threshold voltage when a forward current in a direction from the drain electrode toward the source electrode flows, and so as to make a time variation in the gate voltage have a point from which a rate of the time variation starts decreasing at a voltage between the second threshold voltage and the first threshold voltage when the forward current is to be shutdown, the gate control device configured to control a difference between the gate voltage and a drain voltage so as to make the difference equal to or higher than the second threshold voltage when a reverse current in a direction from the source electrode toward the drain electrode flows, and so as to make a time variation in the difference between the gate voltage and the drain voltage have a point from which a rate of the time variation starts decreasing at a voltage between the second threshold voltage and the first threshold voltage and so as to subsequently keep the difference lower than the first threshold voltage when the difference is reduced from the second threshold voltage.

3. The device according to claim 2, configured to further control the difference between the gate voltage and the drain voltage so as to maintain the difference at a voltage between the second threshold voltage and the first threshold voltage for a first predetermined time and subsequently keep the difference less than the first threshold voltage for a second predetermined time by a time when the reverse current is shut down when the difference is reduced from the second threshold voltage.

4. The device according to claim 3, wherein a sum of the first predetermined time and the second predetermined time is equal to or longer than 18 nanoseconds.

5. The device according to claim 1, wherein the junction field effect transistor is a GaN based HEMT.

6. The device according to claim 5, wherein the gate electrode has stacked structure with p-type GaN based semiconductor and metal.

7. A semiconductor device comprising:

a junction field effect transistor including a source electrode, a drain electrode, and a gate electrode, the transistor having a first threshold voltage at which the transistor is turned on, and a second threshold voltage at which conductivity modulation occurs in the transistor; and a gate control device configured to control a gate voltage to be applied to the gate electrode so as to make the gate voltage equal to or higher than the second threshold voltage when a forward current in a direction from the drain electrode toward the source electrode flows, and so as to make a time variation in the gate voltage have a point from which a rate of time variation starts decreasing at a voltage between the second threshold voltage and the first threshold voltage when the forward current is to be shut down, so as to maintain the gate voltage at a voltage between the second threshold voltage and the first threshold voltage for a predetermined time when the forward current to be shut down, wherein the predetermined time is equal to or longer than 18 nanoseconds.

8. The device according to claim 7, wherein the junction field effect transistor is a GaN based HEMT.

9. The device according to claim 8, wherein the gate electrode has stacked structure with p-type GaN based semiconductor and metal.

10. A semiconductor device comprising:

a junction field effect transistor including a source electrode, a drain electrode, and a gate electrode, the transistor having a first threshold voltage at which the transistor is turned on, and a second threshold voltage at which conductivity modulation occurs in the transistor and a gate control device configured to control a gate voltage to be applied to the gate electrode so as to make the gate voltage equal to or higher than the second threshold voltage when a forward current in a direction from the drain electrode toward the source electrode flows, so as to make a time variation in the gate voltage have a point from which a rate of time variation starts decreasing at a voltage between the second threshold voltage and the first threshold voltage when the forward current is to be shut down, the gate control device configured to control a difference between the gate voltage and a drain voltage so as to make the difference equal to or higher than the second threshold voltage when a reverse current in a direction from the source electrode toward the drain electrode flows, and so as to make a time variation in the difference between the gate voltage and the drain voltage have a point from which a rate of the time variation starts decreasing at a voltage between the second threshold voltage and the first threshold voltage and so as to subsequently keep the difference lower than the first threshold voltage when the difference is reduced from the second threshold voltage.

11. The device according to claim 10, configured to further control the difference between the gate voltage and the drain voltage so as to maintain the difference at a voltage between the second threshold voltage and the first threshold voltage for a first predetermined time and subsequently keep the difference less than the first threshold voltage for a second predetermined time by a time when the reverse current is shut down when the difference is reduced from the second threshold voltage.

12. The device according to claim 11, wherein a sum of the first predetermined time and the second predetermined time is equal to or longer than 18 nanoseconds.

13. A method for controlling a semiconductor device, the method comprising:

controlling a gate voltage to be applied to a gate electrode of a junction field effect transistor including a source electrode, a drain electrode, and the gate electrode, the transistor having a first threshold voltage at which the transistor is turned on, and a second threshold voltage at which conductivity modulation occurs in the transistor, so as to make the gate voltage equal to or higher than the second threshold voltage when a forward current in a direction from the drain electrode toward the source electrode flows, so as to make a time variation in the gate voltage have a point from which a rate of the time variation starts decreasing at a voltage between the second threshold voltage and the first threshold voltage when the forward current to be shut down, and so as to maintain the gate voltage at a voltage between the second threshold voltage and the first threshold voltage for a predetermined time when the forward current is to be shut down, wherein the predetermined time is equal to or longer than 18 nanoseconds.

14. A method for controlling a semiconductor device, the method comprising:

controlling a gate voltage to be applied to a gate electrode of a junction field effect transistor including a source electrode, a drain electrode, and the gate electrode, the transistor having a first threshold voltage at which the transistor is turned on, and a second threshold voltage at which conductivity modulation occurs in the transistor, so as to make the gate voltage equal to or higher than the second threshold voltage when a forward current in a direction from the drain electrode toward the source electrode flows, and so as to make a time variation in the gate voltage have a point from which a rate of the time variation starts decreasing at a voltage between the second threshold voltage and the first threshold voltage when the forward current is to be shut down, and controlling a difference between the gate voltage and a drain voltage so as to make the difference equal to or higher than the second threshold voltage when a reverse current in a direction from the source electrode toward the drain electrode flows, so as to make a time variation in the difference between the gate voltage and the drain voltage have a point from which a rate of the time variation starts decreasing at a voltage between the second threshold voltage and the first threshold voltage and so as to subsequently keep the difference lower than the first threshold voltage when the difference is reduced from the second threshold voltage.

15. The method according to claim 14, further comprising:

controlling the difference between the gate voltage and the drain voltage so as to maintain the difference at a voltage between the second threshold voltage and the first threshold voltage for a first predetermined time and subsequently keep the difference less than the first threshold voltage for a second predetermined time by a time when the reverse current is shut down when the difference is reduced from the second threshold voltage.

16. The method according to claim 15, wherein a sum of the first predetermined time and the second predetermined time is equal to or longer than 18 nanoseconds.

17. A gate control device for controlling a gate voltage to be applied to a gate electrode of a junction field effect transistor including a source electrode, a drain electrode, and the gate electrode, the transistor having a first threshold voltage at which the transistor is turned on, and a second threshold voltage at which conductivity modulation occurs in the transistor, so as to make the gate voltage equal to or higher than the second threshold voltage when a forward current in a direction from the drain electrode toward the source electrode flows, so as to make a time variation in the gate voltage have a point from which a rate of the time variation starts decreasing at a voltage between the second threshold voltage and the first threshold voltage when the forward current to be shut down, and so as to maintain the gate voltage at a voltage between the second threshold voltage and the first threshold voltage for a predetermined time when the forward current to be shut down, wherein predetermined time is equal to or longer than 18 nanoseconds.

18. A gate control device for controlling a gate voltage to be applied to a gate electrode of a junction field effect transistor including a source electrode, a drain electrode, and the gate electrode, the transistor having a first threshold voltage at which the transistor is turned on, and a second threshold voltage at which conductivity modulation occurs in the transistor, so as to make the gate voltage equal to or higher than the second threshold voltage when a forward current in a direction from the drain electrode toward the source electrode flows, so as to make a time variation in the gate voltage have a point from which a rate of the time variation starts decreasing at a voltage between the second threshold voltage and the first threshold voltage when the forward current is to be shut down, so as to make a difference between the gate voltage and a drain voltage equal to or higher than the second threshold voltage when a reverse current in a direction from the source electrode toward the drain electrode flows, and so as to make a time variation in the difference between the gate voltage and the drain voltage have a point from which a rate of the time variation starts decreasing at a voltage between the second threshold voltage and the first threshold voltage and so as to subsequently keep the difference lower than the first threshold voltage when the difference is reduced from the second threshold voltage.

19. The device according to claim 18, for further controlling the difference between the gate voltage and the drain voltage so as to maintain the difference at a voltage between the second threshold voltage and the first threshold voltage for a first predetermined time and subsequently keep the difference less than the first threshold voltage for a second predetermined time by a time when the reverse current is shut down when the difference is reduced from the second threshold voltage.

20. The device according to claim 19, wherein a sum of the first predetermined time and the second predetermined time is equal to or longer than 18 nanoseconds.

21. A gate control device configured to control a gate voltage to be applied to a gate electrode of a junction field effect transistor including a source electrode, a drain electrode, and the gate electrode, the transistor having a first threshold voltage at which the transistor is turned on, and a second threshold voltage at which conductivity modulation occurs in the transistor,
so as to make the gate voltage equal to or higher than the second threshold voltage when a forward current in a direction from the drain electrode toward the source electrode flows, and
so as to make a time variation in the gate voltage have a first point and a second point between the first threshold voltage and the second threshold voltage when the forward current is to be shut down, a rate of the time variation starts decreasing from the first point and a rate of the time variation starts increasing from the second point.

22. The device according to claim 21, wherein the junction field effect transistor is a GaN based HEMT.

23. The device according to claim 22, wherein the gate electrode has stacked structure with p-type GaN based semiconductor and metal.

24. A semiconductor device comprising:
a junction field effect transistor including a source electrode, a drain electrode, and a gate electrode, the transistor having a first threshold voltage at which the transistor is turned on, and a second threshold voltage at which conductivity modulation occurs in the transistor; and
a gate control device configured to control a gate voltage to be applied to the gate electrode so as to make the gate voltage equal to or higher than the second threshold voltage when a forward current in a direction from the drain electrode toward the source electrode flows, and, so as to make a time variation in the gate voltage have a first point and a second point between the first threshold voltage and the second threshold voltage when the forward current is to be shut down, a rate of the time variation starts decreasing from the first point and a rate of the time variation starts increasing from the second point.

25. The device according to claim 24, wherein the junction field effect transistor is a GaN based HEMT.

26. The device according to claim 25, wherein the gate electrode has stacked structure with p-type GaN based semiconductor and metal.

27. A method for controlling a semiconductor device, the method comprising:
controlling a gate voltage to be applied to a gate electrode of a junction field effect transistor including a source electrode, a drain electrode, and the gate electrode, the transistor having a first threshold voltage at which the transistor is turned on, and a second threshold voltage at which conductivity modulation occurs in the transistor,
so as to make the gate voltage equal to or higher than the second threshold voltage when a forward current in a direction from the drain electrode toward the source electrode flows, and
so as to make a time variation in the gate voltage have a first point and a second point between the first threshold voltage and the second threshold voltage when the forward current is to be shut down, a rate of the time variation starts decreasing from the first point and a rate of the time variation starts increasing from the second point.

28. A gate control device for controlling a gate voltage to be applied to a gate electrode of a junction field effect transistor including a source electrode, a drain electrode, and the gate electrode, the transistor having a first threshold voltage at which the transistor is turned on, and a second threshold voltage at which conductivity modulation occurs in the transistor,
so as to make the gate voltage equal to or higher than the second threshold voltage when a forward current in a direction from the drain electrode toward the source electrode flows, and
so as to make a time variation in the gate voltage have a first point and a second point between the first threshold voltage and the second threshold voltage when the forward current is to be shut down, a rate of the time variation starts decreasing from the first point and a rate of the time variation starts increasing from the second point.

* * * * *